| (12) | United States Patent | (10) Patent No.: | US 12,364,151 B2 |
|---|---|---|---|
| | Fujimaki et al. | (45) Date of Patent: | Jul. 15, 2025 |

(54) DISPLAY DEVICE, METHOD OF MANUFACTURING DISPLAY DEVICE, ELECTRONIC APPARATUS, AND LIGHTING DEVICE

(71) Applicant: SONY GROUP CORPORATION, Tokyo (JP)

(72) Inventors: Hiroshi Fujimaki, Tokyo (JP); Yoshinori Uchida, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/657,031

(22) Filed: May 7, 2024

(65) Prior Publication Data

US 2024/0292651 A1 Aug. 29, 2024

Related U.S. Application Data

(63) Continuation of application No. 17/290,896, filed as application No. PCT/JP2019/044267 on Nov. 12, 2019, now Pat. No. 11,997,867.

(30) Foreign Application Priority Data

Nov. 14, 2018 (JP) .................................. 2018-213961

(51) Int. Cl.
*H10K 71/40* (2023.01)
*H10K 50/842* (2023.01)
(Continued)

(52) U.S. Cl.
CPC ......... *H10K 71/40* (2023.02); *H10K 50/8426* (2023.02); *H10K 50/844* (2023.02);
(Continued)

(58) Field of Classification Search
CPC ............ H10K 50/8426; H10K 50/844; H10K 50/865; H10K 50/858; H10K 50/841;
(Continued)

(56) References Cited

U.S. PATENT DOCUMENTS

| 2002/0134979 A1 | 9/2002 | Yamazaki et al. |
|---|---|---|
| 2015/0021571 A1 | 1/2015 | Yamakita |

(Continued)

FOREIGN PATENT DOCUMENTS

| CN | 106489301 A | 3/2017 |
|---|---|---|
| EP | 1096303 A2 | 5/2001 |

(Continued)

OTHER PUBLICATIONS

International Search Report and Written Opinion of PCT Application No. PCT/JP2019/044267, issued Dec. 24, 2019, 09 pages of English Translation and 08 pages of ISRWO.

(Continued)

*Primary Examiner* — Kyoung Lee
*Assistant Examiner* — Christina A Sylvia
(74) *Attorney, Agent, or Firm* — CHIP LAW GROUP

(57) ABSTRACT

A display device includes a first substrate, a plurality of light emitting elements that is provided on the first substrate, a second substrate that is provided so as to face a plurality of the light emitting elements, a wall portion that is provided on the first substrate, surrounds an effective pixel area, and supports the second substrate, and a filling resin layer with which a space surrounded by the first substrate, the second substrate, and the wall portion is filled.

15 Claims, 12 Drawing Sheets

(51) Int. Cl.
  *H10K 50/844* (2023.01)
  *H10K 50/86* (2023.01)
  *H10K 59/80* (2023.01)
  *H10K 71/00* (2023.01)
  *H10K 50/858* (2023.01)
  *H10K 59/38* (2023.01)

(52) U.S. Cl.
  CPC ....... *H10K 50/865* (2023.02); *H10K 59/8722* (2023.02); *H10K 59/873* (2023.02); *H10K 71/00* (2023.02); *H10K 50/858* (2023.02); *H10K 59/38* (2023.02); *H10K 59/879* (2023.02); *H10K 59/8792* (2023.02)

(58) Field of Classification Search
  CPC ........ H10K 71/00; H10K 59/38; H10K 59/00; G09F 9/30; H05B 33/02; H05B 33/04; H05B 33/10
  See application file for complete search history.

(56) References Cited

U.S. PATENT DOCUMENTS

| | | | |
|---|---|---|---|
| 2016/0232856 A1* | 8/2016 | Hidaka | G09G 3/20 |
| 2016/0343868 A1 | 11/2016 | Koezuka et al. | |
| 2017/0133626 A1* | 5/2017 | Senoo | H10K 50/805 |
| 2018/0375062 A1* | 12/2018 | Ide | H10K 59/873 |
| 2020/0044185 A1* | 2/2020 | Wu | H10K 59/00 |
| 2020/0259114 A1* | 8/2020 | Jiang | H10K 50/8426 |

FOREIGN PATENT DOCUMENTS

| | | |
|---|---|---|
| JP | 2001-195015 A | 7/2001 |
| JP | 2007-042467 A | 2/2007 |
| JP | 2009-134984 A | 6/2009 |
| JP | 2016-054038 A | 4/2016 |
| KR | 10-2001-0070174 A | 7/2001 |
| KR | 10-2017-0026508 A | 3/2017 |
| WO | 2016/002746 A1 | 1/2016 |

OTHER PUBLICATIONS

Notice of Allowance for U.S. Appl. No. 17/290,896, issued on Jan. 24, 2024, 09 pages.

Non-Final Office Action for U.S. Appl. No. 17/290,896, issued on Sep. 27, 2023, 10 pages.

International Preliminary Report on Patentability of PCT Application No. PCT/JP2019/044267, issued on May 27, 2021, 09 pages of English Translation and 05 pages of IPRP.

* cited by examiner

DISPLAY DEVICE, METHOD OF MANUFACTURING DISPLAY DEVICE, ELECTRONIC APPARATUS, AND LIGHTING DEVICE

CROSS REFERENCE TO RELATED APPLICATIONS

This application is a continuation application of U.S. patent application Ser. No. 17/290,896 filed on May 3, 2021, which is a U.S. National Phase of International Patent Application No. PCT/JP2019/044267 filed on Nov. 12, 2019, which claims priority benefit of Japanese Patent Application No. JP 2018-213961 filed in the Japan Patent Office on Nov. 14, 2018. Each of the above-referenced applications is hereby incorporated herein by reference in its entirety.

TECHNICAL FIELD

The present disclosure relates to a display device, a method of manufacturing a display device, an electronic apparatus, and a lighting device.

BACKGROUND ART

In recent years, organic light emitting diode (OLED) elements are being applied not only to direct-view displays such as monitors and smartphones, but also to ultra-compact displays (micro-displays) that require a pixel pitch of several microns. In addition, the application of OLED elements to lighting devices is also progressing.

The sealing structure of an organic EL display device mainly includes a hollow sealing structure and a solid sealing structure. An organic EL display device with the solid sealing structure has advantages that the panel strength is higher than that of an organic EL display device with the hollow sealing structure, and a flexible structure can be achieved by film sealing.

The organic EL display device with the solid sealing structure is produced by forming a plurality of OLED elements on one main surface of a substrate and then filling the gap between the substrate and a counter substrate with a filling resin. In filling the above gap with the filling resin, it is necessary to set the coating area of the filling resin so that the filling resin does not outflow onto an external connection terminal or the like for connecting to flexible printed circuits (FPC).

For example, in a one drop fill (ODF) method, which is one of the solid sealing structures, the outer peripheral portion of one main surface of the substrate is coated with a sealing resin to form a frame in order to set the coating area of the filling resin, and then the inside of the frame is coated with the filling resin so that the outflow of the filling resin is suppressed. However, if the line width of the sealing resin is made too thin, the frame of the sealing resin may break due to the pressure of the filling resin with which the inside of the frame is coated, and the filling resin may outflow. For this reason, it is necessary to increase the line width of the sealing resin. In addition, since the line width of the seal resin varies widely at the time of applying the sealing resin and the sealing resin spreads at the time of bonding the substrates, it is necessary to increase the width of the coating area of the sealing resin so as to include a margin. Consequently, the ODF solid sealing structure has a problem that the frame area becomes wide.

In order to solve such a problem, for example, Patent Document 1 proposes a display device with the following configuration. That is, there is proposed a display device that includes a first substrate on which a plurality of display elements is arranged, a second substrate arranged so as to face the display elements, and a bonding material that bonds the first substrate and the second substrate, in which a first wall portion that surrounds a display area in which a plurality of the display elements is arranged and that is formed by using a photolithography technique is disposed on the second substrate side of the first substrate, and a second wall portion that surrounds the display area and is formed by using the photolithography technique is disposed on the first substrate side of the second substrate.

CITATION LIST

Patent Document

Patent Document 1: Japanese Patent Application Laid-Open No. 2016-54038

SUMMARY OF THE INVENTION

Problems to be Solved by the Invention

However, in the technique described in Patent Document 1, it is necessary to perform alignment with high accuracy in order to bring a first wall portion and a second wall portion into contact with each other without any shift when a first substrate and a second substrate are bonded to each other.

An object of the present disclosure is to provide a display device and a method of manufacturing a display device in which a first substrate and a second substrate can be easily bonded to each other, an electronic apparatus, and a lighting device.

Solutions to Problems

In order to solve the problems described above, a first disclosure is a display device including a first substrate, a plurality of light emitting elements that is provided on the first substrate, a second substrate that is provided so as to face a plurality of the light emitting elements, a wall portion that is provided on the first substrate, surrounds an effective pixel area, and supports the second substrate, and a filling resin layer with which a space surrounded by the first substrate, the second substrate, and the wall portion is filled.

A second disclosure is an electronic apparatus including the display device of the first disclosure.

A third disclosure is a method of manufacturing a display device, the method including forming a plurality of light emitting elements on a first substrate, forming a wall portion that surrounds an effective pixel area on the first substrate, and after coating an inside of the wall portion with a resin, mounting a second substrate on the wall portion, and curing the resin to bond the first substrate and the second substrate.

A fourth disclosure is a lighting device including a first substrate, a light emitting element that is provided on the first substrate, a second substrate that is provided so as to face the light emitting element, a wall portion that is provided on the first substrate, surrounds a light emitting area, and supports the second substrate, and a filling resin with which a space surrounded by the first substrate, the second substrate, and the wall portion is filled.

MODE FOR CARRYING OUT THE INVENTION

Figure 1:
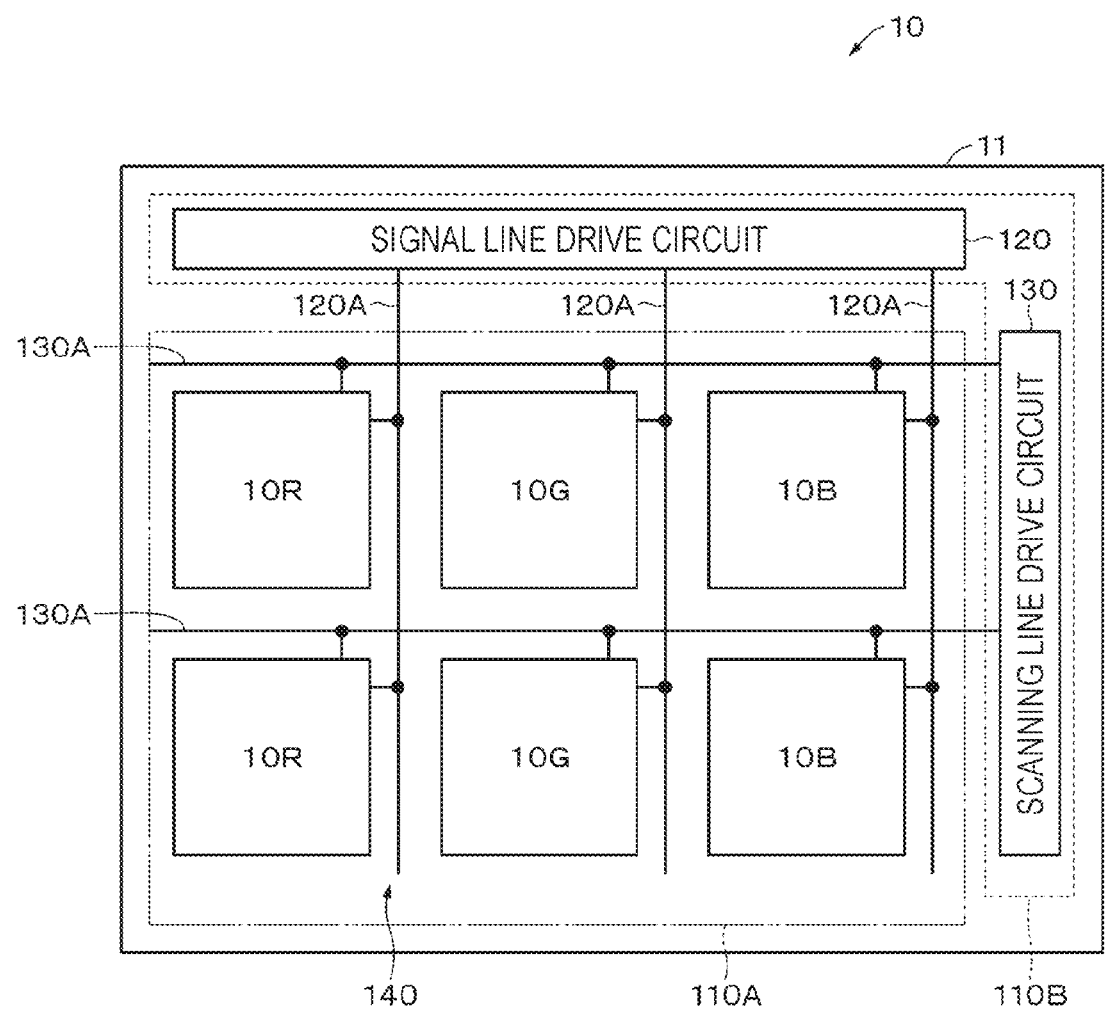
FIG. 1 is a schematic view illustrating an example of an overall configuration of a display device according to one embodiment of the present disclosure.

An embodiment of the present disclosure will be described in the following order. Note that in all the drawings of the following embodiment, the same or corresponding parts are designated by the same reference numerals.

1 Configuration of Display Device
2 Method of Manufacturing Display Device
3 Effects
4 Modifications
5 Application Examples

1 CONFIGURATION OF DISPLAY DEVICE

FIG. 1 illustrates an example of an overall configuration of an organic EL display device 10 (hereinafter, simply referred to as "display device 10") according to one embodiment of the present disclosure. The display device 10 is used in an electronic apparatus such as an organic EL television device, and includes, on a substrate 11, a display area 110A and a peripheral area 110B that is arranged on the periphery of the display area 110A. A plurality of sub-pixels 10R, 10G, and 10B is arranged in a matrix within the display area 110A. The sub-pixel 10R displays red, the sub-pixel 10G displays green, and the sub-pixel 10B displays blue.

Columns of each of the sub-pixels 10R, 10G, and 10B, where the sub-pixels in each column display the same color, are repeatedly arranged in a row direction. Consequently, a combination of three sub-pixels 10R, 10G, and 10B arranged in the row direction constitutes one pixel (pixel). The peripheral area 110B includes a signal line drive circuit 120 and a scanning line drive circuit 130, which are drivers for displaying images.

The signal line drive circuit 120 supplies a signal voltage of a video signal corresponding to luminance information supplied from a signal supply source (not illustrated) to selected pixels via signal lines 120A. The scanning line drive circuit 130 is configured with a shift register or the like that sequentially shifts (transfers) a start pulse in synchronization with an input clock pulse. The scanning line drive circuit 130 scans pixels on a row basis when writing the video signals to the respective pixels, and sequentially supplies a scanning signal to each scanning line 130A.

Figure 2:
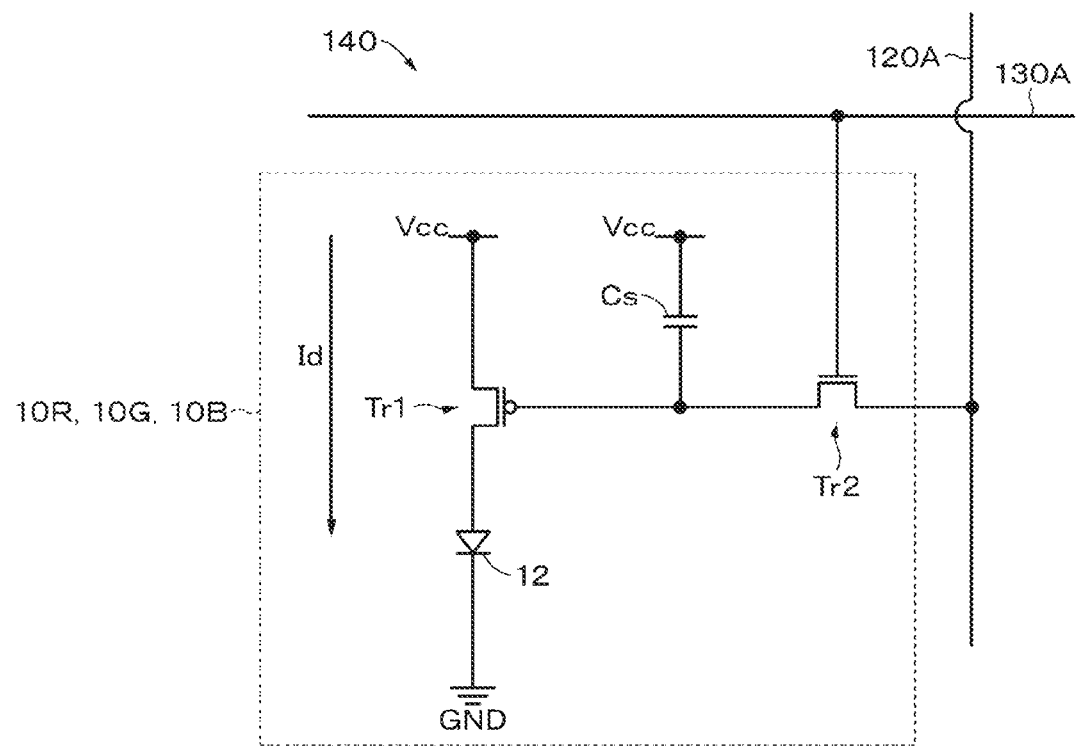
FIG. 2 is a schematic view illustrating an example of a configuration of a pixel drive circuit.

The display area 110A includes a pixel drive circuit 140. FIG. 2 illustrates an example of a configuration of the pixel drive circuit 140 (example of pixel drive circuit of sub-pixels 10R, 10G, and 10B). The pixel drive circuit 140 is an active drive circuit that is formed under a light emitting element 12. The pixel drive circuit 140 has a drive transistor Tr1 and a write transistor Tr2, and a capacitor (holding capacitance) Cs between the drive transistor Tr1 and the write transistor Tr2. The pixel drive circuit 140 also has the light emitting element 12 that is connected in series with the drive transistor Tr1 between a first power supply line (Vcc) and a second power supply line (GND). That is, each of the sub-pixels 10R, 10G, and 10B includes the light emitting element 12. The drive transistor Tr1 and the write transistor Tr2 are configured with a common thin film transistor (TFT), and its configuration is not particularly limited and, may be, for example, an inverted staggered structure (so-called bottom gate type) or a staggered structure (top gate type). Further, it may be configured so that an insulated gate field effect transistor is formed on a silicon substrate in an on-chip fashion, for example, as in a micro organic light-emitting diode (MicroOLED).

In the pixel drive circuit 140, a plurality of signal lines 120A extending in a column direction is arranged at equal intervals, and a plurality of scanning lines 130A extending in the row direction is also arranged at equal intervals. The intersection of each signal line 120A and each scanning line 130A corresponds to any one of the sub-pixels 10R, 10G, and 10B. Each signal line 120A is connected to the signal line drive circuit 120, and an image signal is supplied from the signal line drive circuit 120 to a source electrode of the write transistor Tr2 via the signal line 120A. Each scanning line 130A is connected to the scanning line drive circuit 130, and a scanning signal is sequentially supplied from the scanning line drive circuit 130 to a gate electrode of the write transistor Tr2 via the scanning line 130A.

Figure 3:
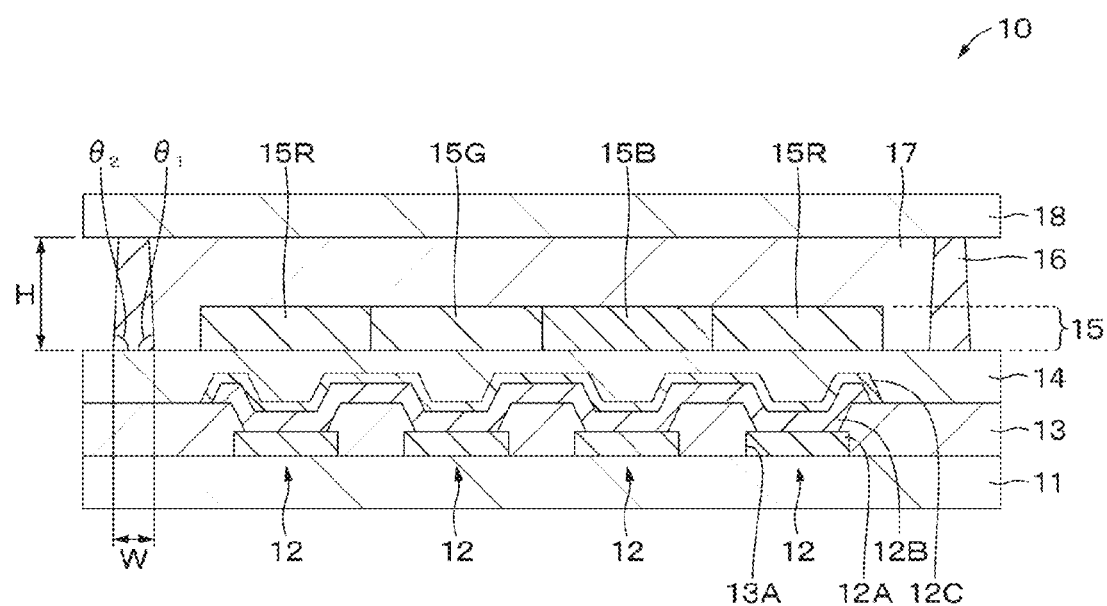
FIG. 3 is a cross-sectional view illustrating an example of a configuration of the display device according to one embodiment of the present disclosure.

FIG. 3 is a cross-sectional view illustrating an example of a configuration of the display device 10 according to one embodiment of the present disclosure. The display device 10 is a top-emission display device, and includes a substrate (first substrate) 11, a plurality of the light emitting elements 12, an insulating layer 13, a protective layer 14, a color filter 15, a wall portion 16, a filling resin layer 17, and a counter substrate (second substrate) 18. It should be noted that the side of the counter substrate 18 is a top side, whereas the side of the substrate 11 is a bottom side.

Figure 4:
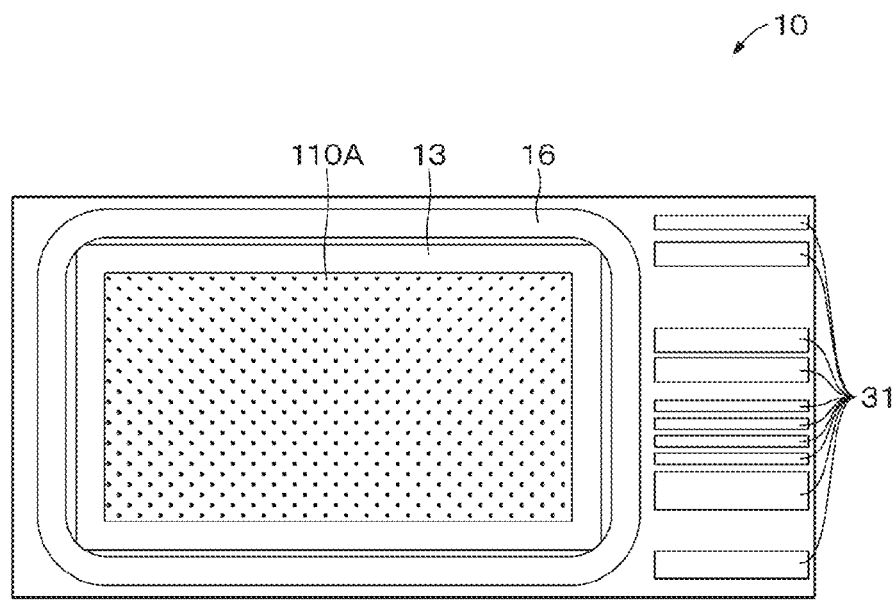
FIG. 4 is a plan view illustrating an example of the configuration of the display device according to one embodiment of the present disclosure.

FIG. 4 is a plan view illustrating an example of the configuration of the display device 10 according to one embodiment of the present disclosure. In FIG. 4, it should be noted that the protective layer 14, the color filter 15, the filling resin layer 17, and the counter substrate 18 are not illustrated in order to facilitate understanding of the positional relationship between the display area 110A and the wall portion 16. The substrate 11 has a rectangular shape, and a plurality of external connection terminals 31 is provided between one short side of the substrate 11 and the wall portion 16. A plurality of the external connection terminals 31 is connected to a control unit (not illustrated) of an electronic apparatus, and the display device 10 is controlled via a plurality of the external connection terminals 31.

The pixel drive circuit 140 that is configured with, for example, a thin film transistor (TFT) or the like is provided on one main surface of the substrate 11, the one main surface facing the counter substrate 18. The pixel drive circuit 140 is electrically connected to each light emitting element 12, and drives each light emitting element 12.

The substrate 11 is a support that includes a plurality of the light emitting elements 12 on the one main surface side, and contains, for example, silicon (Si), quartz, glass, metal foil, polymer resin, or the like, and among these materials, silicon, quartz, or glass is preferable. Examples of the polymer resin include methacrylic resins typified by polymethylmethacrylate (PMMA), polyesters such as polyethylene terephthalate (PET), polyethylene naphthalate (PEN), and polybutylene naphthalate (PBN), polycarbonate resins, and the like.

A plurality of the light emitting elements 12 is arranged in a matrix on the one main surface of the substrate 11. It should be noted that the pixel drive circuit 140 is provided under a plurality of the light emitting elements 12. The light emitting element 12 is a white organic EL light emitting element, and as a colorization method in the display device 10, a method using the white organic EL light emitting elements and the color filter 15 is used. It should be noted that the colorization method is not limited to this, and an RGB coloring method or the like may be used. Alternatively, a monochromatic filter may be used. In the light emitting element 12, a first electrode 12A as, for example, an anode, an organic layer 12B, and a second electrode 12C as, for example, a cathode are laminated in this order from the side of the substrate 11.

The first electrode 12A is electrically separated for each of the sub-pixels 10R, 10G, and 10B. The first electrode 12A also functions as a reflective layer, and preferably contains a material that has a reflectance as high as possible in order to increase the luminous efficiency. Specifically, the first electrode 12A preferably contains a high reflectance material such as aluminum (Al) or aluminum neodymium alloy (AlNd). The constituent material of the first electrode 12A is not limited to the above materials, and at least one of a simple substance of a metal element such as chromium (Cr), gold (Au), platinum (Pt), nickel (Ni), copper (Cu), tungsten (W), or silver (Ag), or an alloy of these metal elements may be used. Further, the first electrode 12A may have a laminated structure of a metal layer and a transparent conductive layer.

The second electrode 12C is provided as an electrode common to all the sub-pixels 10R, 10G, and 10B in the display area 110A. The second electrode 12C is a transparent electrode that is transparent to the light generated in the organic layer 12B. Here, it is assumed that the transparent electrode also includes a semitransparent reflective film. The second electrode 12C contains, for example, a metal or a metal oxide. As the metal, for example, at least one of a simple substance of a metal element such as aluminum (Al), magnesium (Mg), calcium (Ca), or sodium (Na), or an alloy of these metal elements can be used. As the alloy, for example, an alloy of magnesium (Mg) and silver (Ag) (MgAg alloy) or an alloy of aluminum (Al) and lithium (Li) (AlLi alloy) is suitable. As the metal oxide, for example, a metal oxide such as a mixture (ITO) of indium oxide and tin oxide, a mixture (IZO) of indium oxide and zinc oxide, or zinc oxide (ZnO) can be used.

Figure 5:
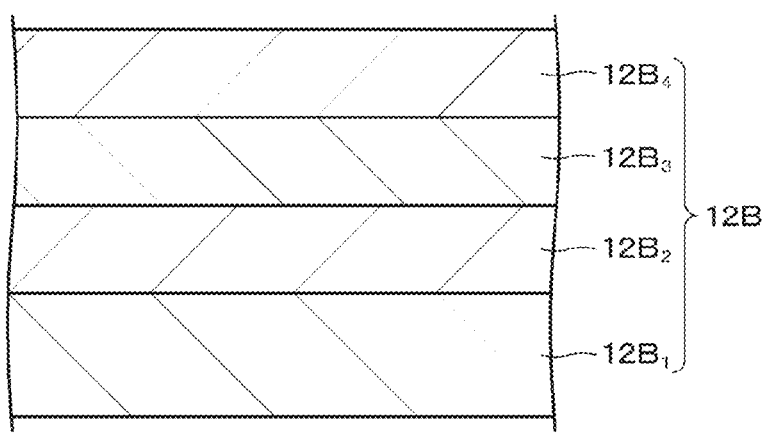
FIG. 5 is an enlarged cross-sectional view illustrating an example of a configuration of an organic layer illustrated in FIG. 3.

The organic layer 12B is provided as an organic layer common to all the sub-pixels 10R, 10G, and 10B in the display area 110A. FIG. 5 is an enlarged view of the organic layer 12B illustrated in FIG. 3. The organic layer 12B is configured so that a hole injection layer $12B_1$, a hole transport layer $12B_2$, a light emitting layer $12B_3$, and an electron transport layer $12B_4$ are laminated in this order from the side of the first electrode 12A. It should be noted that the configuration of the organic layer 12B is not limited to this, and layers other than the light emitting layer $12B_3$ are provided as needed.

The hole injection layer $12B_1$ is provided to increase the hole injection efficiency into the light emitting layer $12B_3$, and is also a buffer layer for suppressing leakage. The hole transport layer $12B_2$ is provided to increase the hole transport efficiency into the light emitting layer $12B_3$. When an electric field is applied to the light emitting layer $12B_3$, electrons and holes are recombined, so that the light emitting layer $12B_3$ generates light. The electron transport layer $12B_4$ is provided to increase the electron transport efficiency into the light emitting layer $12B_3$. An electron injection layer (not illustrated) may be provided between the electron transport layer $12B_4$ and the second electrode 12C. This electron injection layer increases the electron injection efficiency.

The insulating layer 13 is used to electrically separate the first electrode 12A for each of the sub-pixels 10R, 10G, and 10B. The insulating layer 13 has an opening 13A in a portion corresponding to each first electrode 12A, and is provided so as to cover the peripheral edge of the first electrode 12A from a surface (surface facing second electrode 12C) to a side surface (end surface). The insulating layer 13 contains, for example, an organic material or an inorganic material. Examples of the organic material include polyimide, acrylic resin, and the like. Examples of the inorganic material include silicon oxide, silicon nitride, silicon oxynitride, aluminum oxide, and the like.

The protective layer 14 is provided on a plurality of the light emitting elements 12. More specifically, the protective layer 14 is provided so as to cover the insulating layer 13 that is provided in and around the display area 110A. Since the wall portion 16 is formed on the surface of the protective layer 14, the protective layer 14 preferably has a substantially flat surface. By providing the protective layer 14, the light emitting element 12 can be blocked from the outside air, and it is possible to suppress the infiltration of moisture into the light emitting element 12 from the external environment. Further, in a case where the second electrode 12C includes a metal layer, the oxidation of the metal layer can be suppressed by providing the protective layer 14.

The protective layer 14 contains an inorganic material with low hygroscopicity, such as silicon oxide ($SiO_x$), silicon nitride ($SiN_x$), silicon oxynitride ($SiN_xO_y$), titanium oxide ($TiO_x$) or aluminum oxide ($Al_xO_y$). Further, the protective layer 14 may have a single-layer structure, but may have a multi-layer structure in a case where the thickness is increased. This is to relieve the internal stress in the protective layer 14. Furthermore, the protective layer 14 may contain a polymer resin. In this case, as the polymer resin, at least one resin material of a thermosetting resin or an ultraviolet curable resin can be used.

The color filter 15 is a so-called on-chip color filter (OCCF). The color filter 15 includes, for example, a red filter 15R, a green filter 15G, and a blue filter 15B. The red filter 11R, the green filter 11G, and the blue filter 11B are provided so as to face the light emitting element 12 of the sub-pixel 10R, the light emitting element 12 of the sub-pixel 10G, and the light emitting element 12 of the sub-pixel 10B, respectively. As a result, the white light emitted from the respective light emitting elements 12 in the sub-pixel 10R, the sub-pixel 10G, and the sub-pixel 10B passes through the red filter 11R, the green filter 11G, and the blue filter 11B, respectively, so that a red light beam, a green light beam, and a blue light beam are respectively emitted from the display surface. Further, a light-shielding layer (not illustrated) is provided in an area between the color filters of the respective colors, that is, an area between the sub-pixels. It should be noted that the light-shielding layer is provided as needed, and does not need to be provided.

The wall portion 16 is provided on the protective layer 14 so as to surround the effective pixel area. The wall portion 16 sets a coating area where the filling resin for forming the filling resin layer 17 is applied, supports the counter substrate 18, and adjusts the distance between the substrate 11 and the counter substrate 18, more specifically the distance between the protective layer 14 and the counter substrate 18.

When viewed from a direction perpendicular to the one main surface of the substrate 11, as illustrated in FIG. 4, the wall portion 16 has a frame shape in which each corner portion of a rectangle is curved in an R shape or the like. Since the wall portion 16 has a frame shape, the coating area of the filling resin can be set in a manufacturing process of the display device 10. Here, the term "curved" means a curve that projects toward the outside of the wall portion 16. The cross-section of the wall portion 16 in a width direction of the wall portion 16 is, for example, a quadrangle such as a rectangle or a trapezoid. Here, the trapezoid may be an inverted trapezoid. In the present embodiment, since the wall portion 16 is formed by patterning a thin film using a photolithography technique and an etching technique as will be described later, the cross-sectional shape of the wall portion 16 can be formed in a specified shape such as a quadrangle or a trapezoid.

A height H of the wall portion 16 is determined by the total thickness of the color filter 15 and the filling resin layer 17. The ratio (H/W) of the height H and a width W of the wall portion 16 is preferably 1/25 or more and 1/1 or less, and preferably 1/25 or more and 1/10 or less. In a case where the ratio (H/W) is 1/25 or more, the frame can be narrowed. On the other hand, in a case where the ratio (H/W) is 1/1 or less, it is possible to suppress the occurrence of problems that the wall portion 16 collapses or the wall portion 16 is broken by the pressure of the filling resin with which the inside of the wall portion 16 is coated in the production process of the display device 10.

The height H of the wall portion 16 is preferably 2 µm or more and 5 µm or less, and more preferably 3 µm or more and 4 µm or less. If the height H of the wall portion 16 is less than 2 µm, the distance between the protective layer 14 and the counter substrate 18 is too short, and thus it may be difficult to provide the color filter 15 between the protective layer 14 and the counter substrate 18. On the other hand, if the height H of the wall portion 16 is 5 µm or less, it is possible to suppress the occurrence of problems that the wall portion 16 collapses or the wall portion 16 is broken by the pressure of the filling resin with which the inside of the wall portion 16 is coated in the production process of the display device 10.

The width W of the wall portion 16 is preferably 2 µm or more and 50 µm or less, more preferably 10 µm or more and 50 µm or less, still more preferably 10 µm or more and 40 µm or less, and particularly preferably 10 µm or more and 30 µm or less. If the width W of the wall portion 16 is 2 µm or more, it is possible to suppress the occurrence of problems that the wall portion 16 collapses or the wall portion 16 is broken by the pressure of the filling resin with which the inside of the wall portion 16 is coated in the production process of the display device 10. On the other hand, if the width W of the wall portion 16 is 50 µm or less, the frame can be narrowed. In a case where the width of the wall portion 16 changes in a height direction, it should be noted that the width W of the wall portion 16 means the maximum width of the wall portion 16.

It is preferable that a taper angle $\theta 1$ of an inner peripheral surface of the wall portion 16 and a taper angle $\theta 2$ on an outer peripheral surface of the wall portion 16 are each independently 45 degrees or more and 135 degrees or less. If the taper angles $\theta 1$ and $\theta 2$ are 45 degrees or more and 135 degrees or less, it is possible to suppress breaking of a narrow portion of the wall portion 16 by the pressure of the filling resin in the production process of the display device 10. Further, since the maximum width of the wall portion 16 can be reduced as small as possible, the frame can be narrowed. It should be noted that the taper angle $\theta 1$ of the inner peripheral surface of the wall portion 16 and the taper angle $\theta 2$ on the outer peripheral surface of the wall portion 16 may be different from each other.

The wall portion 16 contains an organic material or an inorganic material. As the organic material, for example, a resist or the like can be used. As the resist, for example, a photoresist or an electron beam resist can be used. As the inorganic material, a metal, a metal oxide, a metal nitride (for example, SiN or the like), or the like can be used. Here, it is assumed that the metal also includes a semimetal.

The wall portion 16 does not need to contain a filler. As will be described in the manufacturing method described later, in the present embodiment, after the solid wall portion 16 is formed, the filling resin is applied and the substrate 11 and the counter substrate 18 are bonded to each other, so that even if the wall portion 16 does not contain the filler, the gap between the substrate 11 and the counter substrate 18 can be adjusted.

The filling resin layer 17 is filled in the space surrounded by the protective layer 14, the counter substrate 18, and the wall portion 16. The filling resin layer 17 has a function as an adhesive layer. More specifically, the filling resin layer 17 has an adhesive property for adhering the color filter 15 and the counter substrate 18. Since the filling resin layer 17 has the adhesive property, it is not necessary to provide a sealing resin on the outer peripheral portion of the substrate 11. As a result, the frame can be narrowed. Further, it is not necessary to bond the wall portion 16 and the counter substrate 18 with an adhesive or the like. The filling resin layer 17 contains at least one resin material of a thermosetting resin or an ultraviolet curable resin.

The counter substrate 18 is provided so that one main surface of the counter substrate 18 faces the one main surface of the substrate 11 on which a plurality of the light emitting elements 12 is provided. The counter substrate 18 seals the light emitting element 12, the color filter 15, and the like together with the filling resin layer 17. The counter substrate 18 contains a material such as glass that is transparent to each color light beam emitted from the color filter 15.

2 METHOD OF MANUFACTURING DISPLAY DEVICE

Hereinafter, a method of manufacturing the display device 10 with the configuration described above will be described.

First, the pixel drive circuit 140 and the like are formed on one main surface of the substrate 11 by using, for example, a thin film forming technique, a photolithography technique, and an etching technique. Next, a metal layer is formed on the drive circuit or the like by, for example, a sputtering method, and then is patterned using, for example, the photolithography technique and the etching technique, so that the first electrode 12A that is separated for each light emitting element 12 (that is, each sub-pixel) is formed.

Next, the insulating layer 13 is formed on the first electrode 12A by a chemical vapor deposition (CVD) method, and then is patterned using, for example, the photolithography technique and the etching technique, so that the opening 13A is formed at a position corresponding to each light emitting element 12 (that is, each sub-pixel). Next, the hole injection layer $12B_1$, the hole transport layer $12B_2$, the light emitting layer $12B_3$, and the electron transport layer $12B_4$ are laminated on the first electrode 12A and the insulating layer 13 in this order by, for example, a vapor deposition method, so that the organic layer 12B is formed. Next, the second electrode 12C is formed on the organic layer 12B by, for example, a sputtering method. As a result, a plurality of the light emitting elements 12 is formed on the one main surface of the substrate 11.

Next, the protective layer 14 is formed on the second electrode 12C by, for example, the vapor deposition method or the CVD method, and then the color filter 15 is formed on the protective layer 14. It should be noted that, in order to flatten steps of the protective layer 14 and steps due to the difference in the film thickness of the color filter 15 itself, a flattening layer may be formed on or under, or on and under the color filter 15. Next, the solid wall portion 16 is formed on the protective layer 14 so as to surround an effective pixel area. More specifically, after a thin film such as an organic material layer or an inorganic material layer is formed outside the effective pixel area on the protective layer 14 or on the entire protective layer 14, the thin film is patterned by using the photolithography technique and the etching technique, so that the wall portion 16 surrounding the effective pixel area is formed. As the organic material layer, for example, a resist layer can be used. As the inorganic material layer, for example, a metal layer, a metal oxide layer, or a metal nitride layer can be used.

Next, the space surrounded by the wall portion 16 is filled with (coated with) a filling resin, the color filter 15 is covered with the filling resin, and then the counter substrate 18 is mounted on the wall portion 16. Next, for example, by applying heat to the filling resin or irradiating the filling resin with ultraviolet rays to cure the filling resin, the substrate 11 and the counter substrate 18 are bonded to each other via the filling resin. As a result, the display device 10 is sealed. In a case where the filling resin contains both a thermosetting resin and an ultraviolet curable resin, it should be noted that the filling resin may be irradiated with ultraviolet rays to be temporarily cured, and then heat may be applied to the filling resin to main cure the filling resin.

3 EFFECTS

As described above, since the wall portion 16 surrounding the effective pixel area is provided only on the side of the substrate 11 in the display device 10 according to one embodiment, it is not necessary to perform alignment with high accuracy at the time of bonding the substrate 11 and the counter substrate 18 each other. Consequently, the substrate 11 and the counter substrate 18 can be easily bonded to each other.

Further, in the method of manufacturing the display device 10 according to one embodiment, the solid wall portion 16 is formed and then the filling resin is applied to bond the substrate 11 and the counter substrate 18, so that the display device 10 is sealed. As a result, even if the width of the wall portion 16 that defines the coating area of the filling resin is narrow, the risk that the wall portion 16 is broken at the time of bonding the substrate 11 and the counter substrate 18 can be reduced. Further, since the wall portion 16 is in a solid state, the width of the wall portion 16 does not increase at the time of bonding the substrate 11 and the counter substrate 18 to each other. Furthermore, since the substrate 11 and the counter substrate 18 are bonded to each other by the filling resin, it is not necessary to provide a sealing resin so as to surround the effective pixel area. Consequently, the frame can be narrowed as compared with the ODF solid sealing structure in which a liquid sealing resin is applied so as to surround the effective pixel area for the purpose of forming the frame, and then the inside of the frame is coated with the filling resin.

Further, since the wall portion 16 is formed by using a combination of the photolithography technique and the etching technique in the method of manufacturing the display device 10 according to one embodiment, variations in the width and cross-sectional shape of the wall portion 16 can be suppressed.

Furthermore, in a method of manufacturing a display device using the ODF method, a filler for setting a gap between a substrate and a counter substrate is normally required to be contained in the sealing resin surrounding the effective pixel area. On the other hand, in the method of manufacturing the display device 10 according to one embodiment, which has been described above, since the solid wall portion 16 is formed and then the substrate 11 and the counter substrate 18 are bonded to each other, the wall portion 16 does not need to contain the filler. As a result, the configuration of the display device 10 can be simplified.

Further, since the wall portion 16 is provided on the surface of the protective layer 14 in the display device 10 according to one embodiment, the wall portion 16 does not hinder the work in the respective steps from the step of forming the pixel drive circuit 140 to the step of forming the color filter 15. Consequently, by providing the wall portion 16, it is possible to prevent the respective steps described above from becoming complicated.

4 MODIFICATIONS

First Modification

Figure 6:
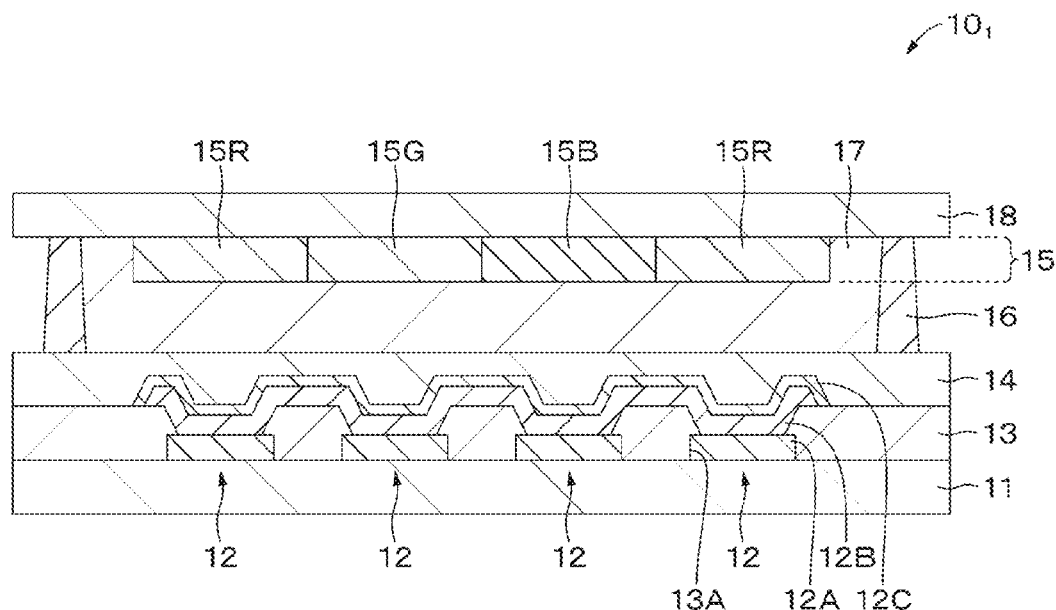
FIG. 6 is a cross-sectional view illustrating an example of a configuration of a display device according to a first modification of one embodiment of the present disclosure.

FIG. 6 illustrates an example of a configuration of a display device $10_1$ according to a first modification of one embodiment of the present disclosure. The display device $10_1$ is different from the display device 10 according to one embodiment in that the color filter 15 is provided on the one main surface of the counter substrate 18, the one main surface facing the substrate 11, and the filling resin layer 17 is provided between the protective layer 14 and the color filter 15.

The display device $10_1$ with the configuration described above is manufactured as follows. First, the respective layers are formed in a similar manner to that of one embodiment until the protective layer 14 is formed, and then the wall portion 16 is formed on the protective layer 14 so as to surround an effective pixel area. Next, the effective pixel area on the protective layer 14 is filled with (coated with) a filling resin, and then the counter substrate 18 having the color filter 15 formed in advance on one main surface is prepared, and the counter substrate 18 is mounted on the wall portion 16 so that the one main surface of the counter substrate 18, on which the color filter 15 is formed, faces the one main surface of the substrate 11. At this time, the mounting position of the counter substrate 18 on the substrate 11 is adjusted so that the red filter 11R, the green filter 11G, and the blue filter 11B face the light emitting element 12 of the sub-pixel 10R, the light emitting element 12 of the sub-pixel 10G, and the light emitting element 12 of the sub-pixel 10B, respectively. Next, for example, by applying heat to the filling resin or irradiating the filling resin with ultraviolet rays to cure the filling resin, the substrate 11 and the counter substrate 18 are bonded to each other. As a result, the display device $10_1$ is sealed.

In the display device $10_1$ according to the first modification of one embodiment described above, it is necessary to adjust the position of the counter substrate 18 with respect to the respective sub-pixels 10R, 10G, and 10B, but the position of the counter substrate 18 with respect to the wall portion 16 does not need to be adjusted with high accuracy.

Second Modification

Figure 7:
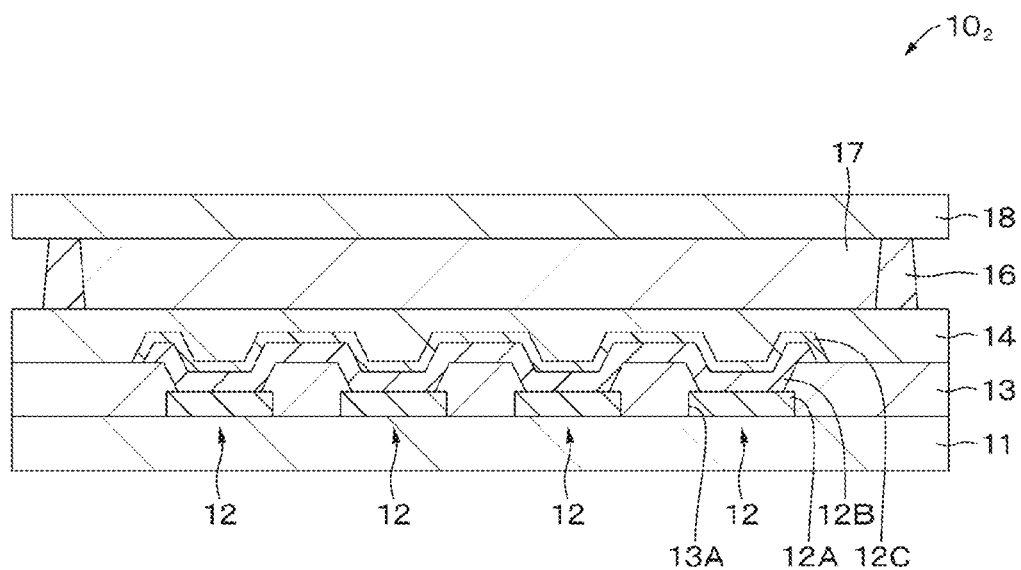
FIG. 7 is a cross-sectional view illustrating an example of a configuration of a display device according to a second modification of one embodiment of the present disclosure.

FIG. 7 illustrates an example of a configuration of a display device $10_2$ according to a second modification of one embodiment of the present disclosure. The display device $10_2$ is different from the display device 10 according to one embodiment in that the color filter 15 is not provided.

The display device $10_2$ with the configuration described above is manufactured as follows. First, the respective layers are formed in the same manner as that of one embodiment until the wall portion 16 is formed. Next, the color filter 15 is not formed on the protective layer 14 and the area surrounded by the wall portion 16 is filled with (coated with) a filling resin, the color filter 15 is covered with the filling resin, and then the counter substrate 18 is mounted on the wall portion 16. Next, for example, by applying heat to the filling resin or irradiating the filling resin with ultraviolet rays to cure the filling resin, the substrate 11 and the counter substrate 18 are bonded to each other via the filling resin. As a result, the display device $10_2$ is sealed.

In the display device $10_2$ according to the second modification of one embodiment described above, it is not necessary to perform alignment with high accuracy when the substrate 11 and the counter substrate 18 are bonded to each other, similarly to one embodiment.

Third Modification

Figure 8:
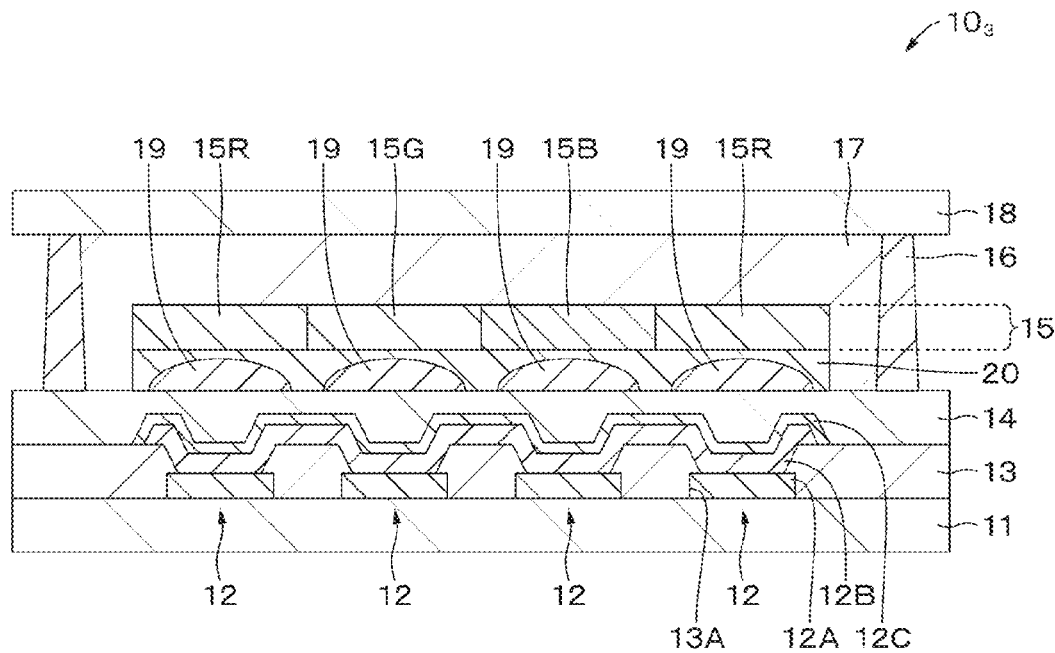
FIG. 8 is a cross-sectional view illustrating an example of a configuration of a display device according to a third modification of one embodiment of the present disclosure.

FIG. 8 illustrates an example of a configuration of a display device $10_3$ according to a third modification of one embodiment of the present disclosure. The display device $10_3$ is different from the display device 10 according to one embodiment in that a structure 19 such as a microlens or a diffraction grating, the structure 19 being disposed between the protective layer 14 and the color filter 15, and a flattening layer 20 disposed between the structure 19 and the color filter 15 are further provided.

Each structure 19 is provided to improve the brightness of the display device 103, and is disposed for each light emitting element 12 (that is, for each sub-pixel). Here, the case where the structure 19 is provided between the protective layer 14 and the color filter 15 is described, but the structure 19 may be provided on the color filter 15. Alternatively, the color filter 15 may be provided on one main surface of the counter substrate 18, the one main surface facing the light emitting element 12.

The display device $10_3$ with the configuration described above is manufactured as follows. First, the respective layers are formed in a similar manner to that of one embodiment until the protective layer 14 is formed. Next, the structure 19 is formed on the protective layer 14. Specifically, for example, an organic layer containing a resist or the like or an inorganic layer containing SiN or the like is formed on the protective layer 14, and then the organic layer or the inorganic layer is processed by using, for example, a photolithography technique and an etching technique, so that the structure 19 is formed. Alternatively, the protective layer 14 is coated with a thermosetting resin or an ultraviolet curable resin and then shapes are transferred to the thermosetting resin or the ultraviolet curable resin by using a nanoimprint technique, so that the structure 19 is formed. Next, the flattening layer 20 is formed on the structure 19, the recesses and projections of the structure 19 are flattened, and then the color filter 15 is formed on the flattening layer 20. Subsequent steps are similar to those in one embodiment, and the display device $10_3$ is sealed.

Since the display device $10_3$ according to the third modification of one embodiment described above includes the structure 19 such as a microlens or a diffraction grating between the protective layer 14 and the color filter 15, the brightness of the display device $10_3$ can be improved.

Fourth Modification

Figure 9:
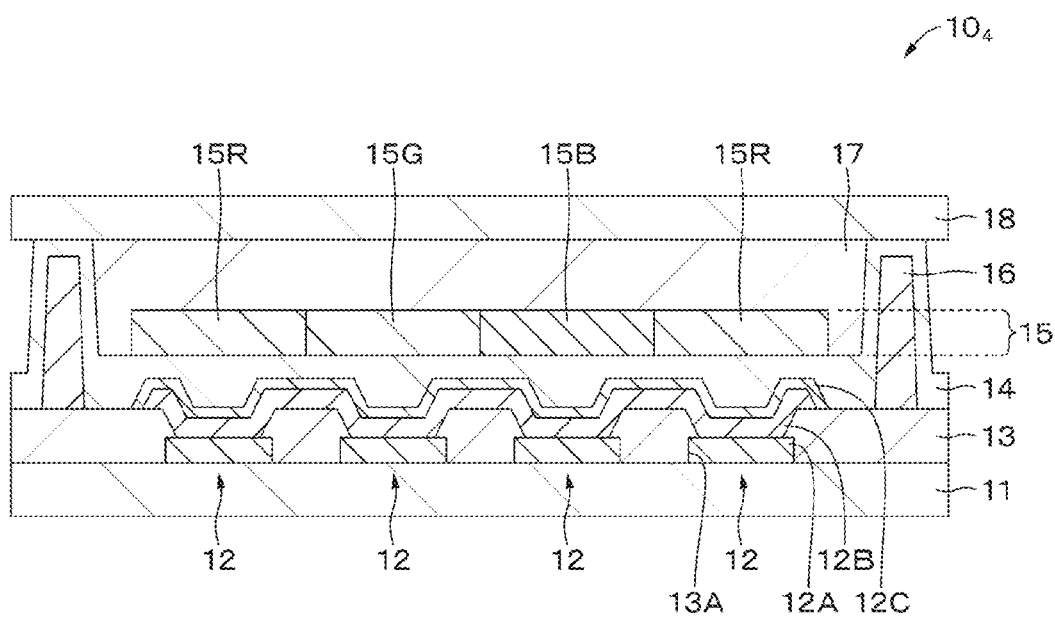
FIG. 9 is a cross-sectional view illustrating an example of a configuration of a display device according to a fourth modification of one embodiment of the present disclosure.

FIG. 9 illustrates an example of a configuration of a display device $10_4$ according to a fourth modification of one embodiment of the present disclosure. The display device $10_4$ is different from the display device 10 according to one embodiment in that the wall portion 16 is provided on the insulating layer 13 provided outside the display area 110A, and the protective layer 14 is provided so as to cover the display area 110A and the wall portion 16. In the display device $10_4$ according to the fourth modification, the wall portion 16 contains metal, so that the wall portion 16 also functions as a metal contact portion for connecting the second electrode 12C to cathode wires (not illustrated) on a drive circuit side.

The display device $10_4$ with the configuration described above is manufactured as follows. First, the respective layers are formed in a similar manner to that of one embodiment until the insulating layer 13 is formed. Next, the wall portion 16 is formed on the insulating layer 13 provided outside the display area 110A so as to surround the display area 110A. Next, the organic layer 12B and the second electrode 12C are sequentially formed in a similar manner to that of the first embodiment. Next, the protective layer 14 is formed so as to cover the display area 110A and the wall portion 16.

Next, the color filter 15 is formed on the protective layer 14. Next, the space surrounded by the wall portion 16 is filled with (coated with) a filling resin, the color filter 15 is covered with the filling resin, and then the counter substrate 18 is mounted on the wall portion 16. Next, by curing the filling resin, the substrate 11 and the counter substrate 18 are bonded to each other via the filling resin. As a result, the display device $10_4$ is sealed.

It should be noted that the above fourth modification describes the example in which the wall portion 16 is formed after the insulating layer 13 is formed and before the organic layer 12B is formed, but the wall portion 16 may be formed after the second electrode 12C is formed and before the protective layer 14 is formed.

Fifth Modification

Figure 10:
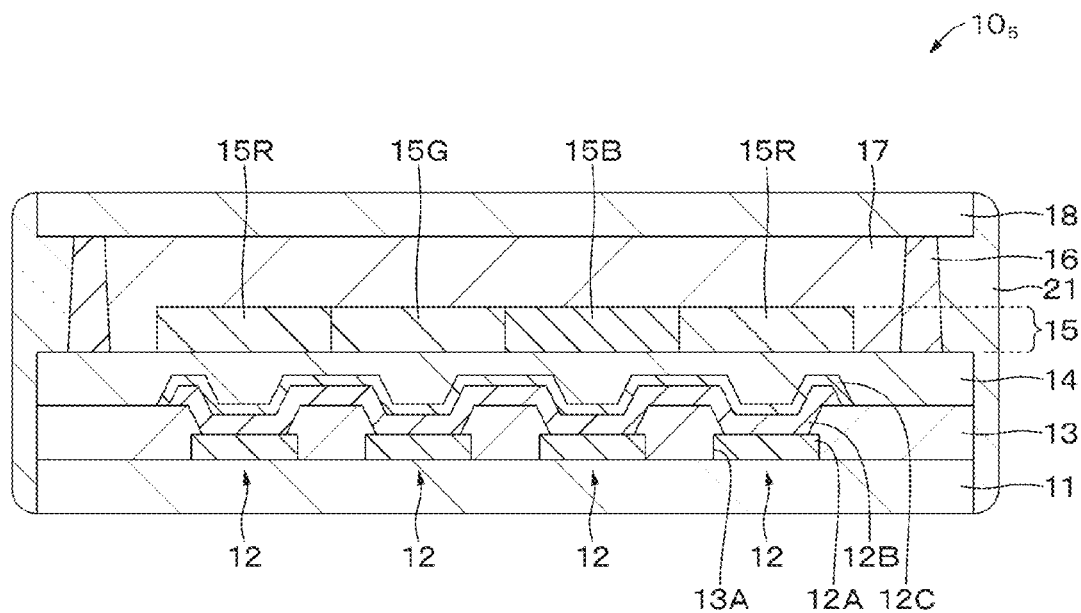
FIG. 10 is a cross-sectional view illustrating an example of a configuration of a display device according to a fifth modification of one embodiment of the present disclosure.

FIG. 10 illustrates an example of a configuration of a display device $10_5$ according to a fifth modification of one embodiment of the present disclosure. The display device $10_5$ is different from the display device 10 according to one embodiment in that a protective member 21 is provided on the peripheral surface (end surface) of the display device $10_5$.

The protective member 21 includes, for example, at least one of a thermosetting resin or an ultraviolet curable resin. The protective member 21 may have an adhesive function to adhere the substrate 11 and the counter substrate 18. In this case, since the substrate 11 and the counter substrate 18 can be adhered to each other by both the filling resin layer 17 and the protective member 21, the reliability of the display device $10_5$ can be improved.

The display device $10_5$ with the configuration described above is manufactured as follows. First, the display device 10 is produced in a similar manner to that of the first embodiment. Next, a resin material is applied to the peripheral surface of the display device 10 and cured to form the protective member 21 on the peripheral surface of the display device 10.

In a case where the protective member 21 includes both the thermosetting resin and the ultraviolet curable resin, the protective member 21 may be formed as follows. The resin material with which the peripheral surface is coated is irradiated with ultraviolet rays from one main surface side of the display device 10 to be temporarily cured, and then heat is applied to the filling resin to main cure the filling resin.

Since the display device $10_5$ according to the fifth modification of one embodiment described above includes the protective member 21 on the peripheral surface of the display device $10_5$, the peripheral surface of the display device $10_5$ can be protected. Specifically, for example, cracking or chipping of peripheral edge portions of the substrate 11 and the counter substrate 18 can be suppressed.

Sixth Modification

Figure 11:
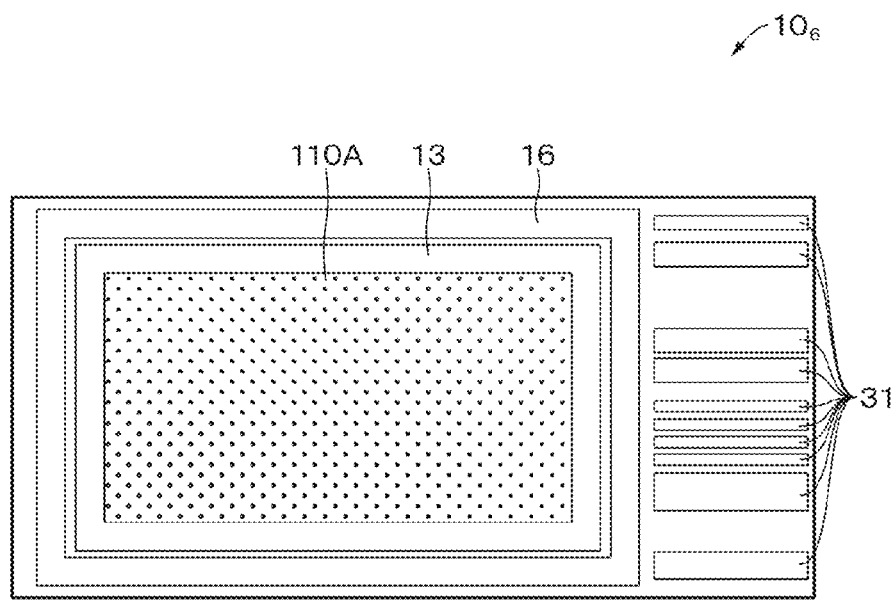
FIG. 11 is a cross-sectional view illustrating an example of a configuration of a display device according to a sixth modification of one embodiment of the present disclosure.

FIG. 11 illustrates an example of a configuration of a display device $10_6$ according to a sixth modification of one embodiment of the present disclosure. The display device $10_6$ is different from the display device 10 according to the first embodiment in that the wall portion 16 has a quadrangular frame shape. Note that it suffices that the shape of the wall portion 16 is a shape capable of surrounding an effective pixel area, and a shape other than the shapes described in one embodiment and the sixth modification may be adopted.

Seventh Modification

Figure 12:
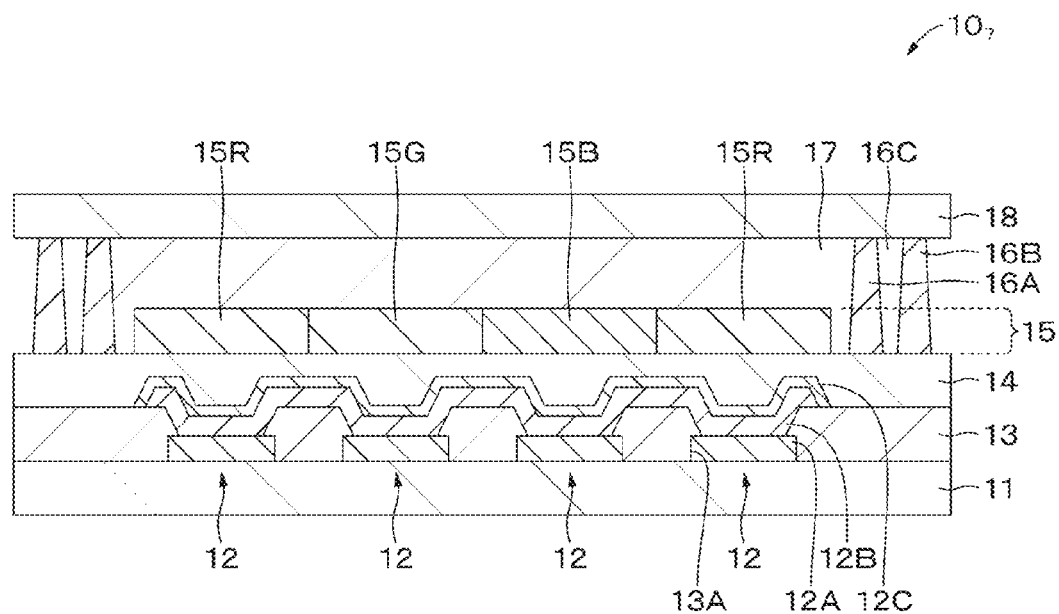
FIG. 12 is a cross-sectional view illustrating an example of a configuration of a display device according to a seventh modification of one embodiment of the present disclosure.

FIG. 12 illustrates an example of a configuration of a display device $10_7$ according to a seventh modification of one embodiment of the present disclosure. The display device $10_7$ is different from the display device 10 according to one embodiment in that an inner wall portion (first wall portion) 16A that has an annular shape, surrounds an effective pixel area, and supports the counter substrate 18, and an outer wall portion (second wall portion) 16B that has an annular shape, is provided outside the inner wall portion 16A, surrounds the inner wall portion 16A, and supports the counter substrate 18 are provided. The inner wall portion 16A has one or two or more holes $16A_1$ penetrating the inner wall portion 16A in the width direction. Further, a space 16C is provided between the inner wall portion 16A and the outer wall portion 16B. FIG. 12 illustrates an example in which the hole $16A_1$ is provided at a portion corresponding to a corner of the inner wall portion 16A, but the position where the hole $16A_1$ is provided is not limited to this, for example, the hole $16A_1$ may be provided at a portion corresponding to a side of the inner wall portion 16A.

Figure 13:
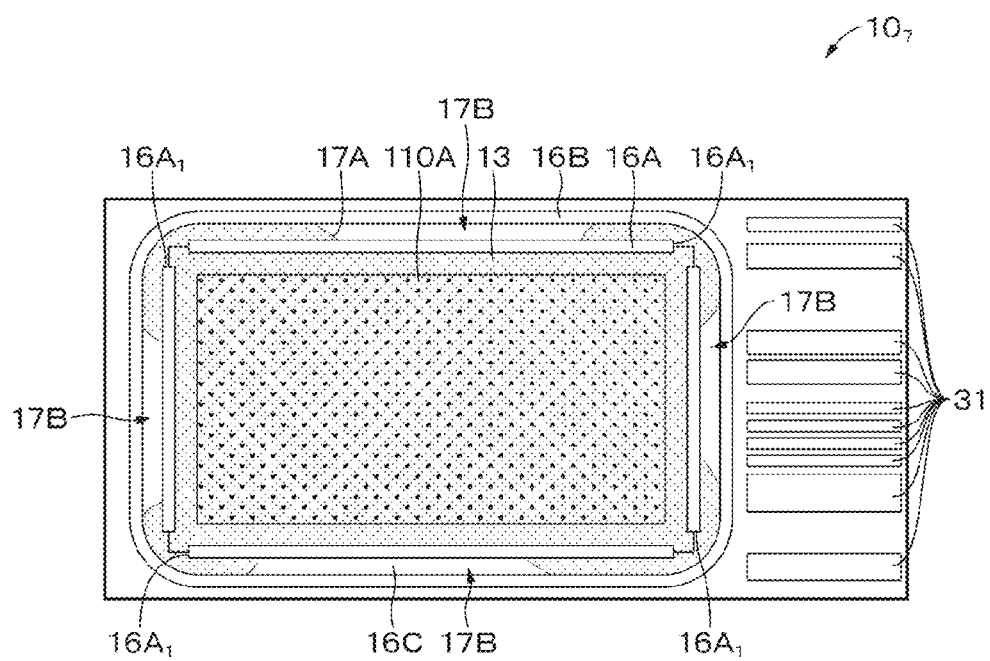
FIG. 13 is a diagram of a state where no voids and bubbles enter an effective pixel area.

According to the display device $10_7$ with the configuration described above, as illustrated in FIG. 13, in the manufacturing process of the display device $10_7$, in a case where voids 17B and bubbles (hereinafter, referred to as "voids 17B and the like") not filled with the filling resin 17A are generated in the area inside the inner wall portion 16A, the voids 17B and the like can be released from the inside of the inner wall portion 16A to the space 16C through the holes $16A_1$. Consequently, it is possible to suppress the generation of the voids 17B and the like in the effective pixel area. As a result, the occurrence of defective products can be suppressed.

Figure 14:
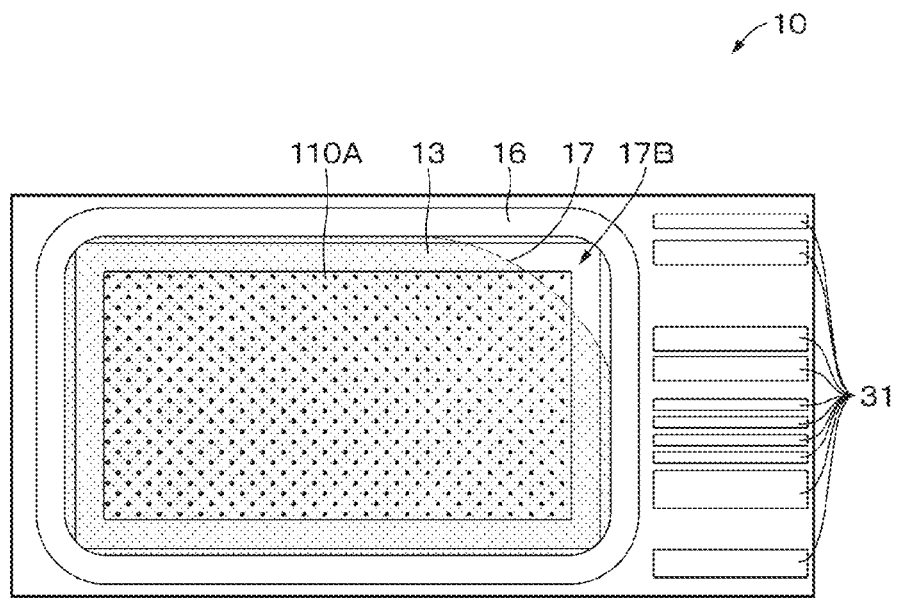
FIG. 14 is a diagram of a state where voids and bubbles enter the effective pixel area.

On the other hand, in the display device 10 according to one embodiment, as illustrated in FIG. 14, in a case where the voids 17B and the like are generated in the area inside the wall portion 16 in the manufacturing process of the display device 10, the voids and the like may enter the effective pixel area. In a case where the voids 17B and the like enter the effective pixel area as described above, a defective product is generated.

In the seventh modification, the wettability of the inner wall portion 16A with respect to the filling resin 17A may be better than the wettability of the outer wall portion 16B with respect to the filling resin 17A. That is, the wettability of the inner wall portion 16A with respect to the filling resin 17A may be good, whereas the wettability of the outer wall portion 16B with respect to the filling resin 17A may be poor and thus the filling resin 17A is repelled.

Since the inner wall portion 16A and the outer wall portion 16B have the wettability as described above, the filling resin 17A easily stays inside the inner wall portion 16A. Consequently, it is possible to suppress the occurrence of outflow defects in which the filling resin 17A flows over the outer wall portion 16B. Further, since the voids 17B and the like are likely to gather on the side of the outer wall portion 16B contrary to the filling resin 17A, it is possible to further suppress the generation of the voids 17B and the like in the effective pixel area.

Eighth Modification

Figure 15:
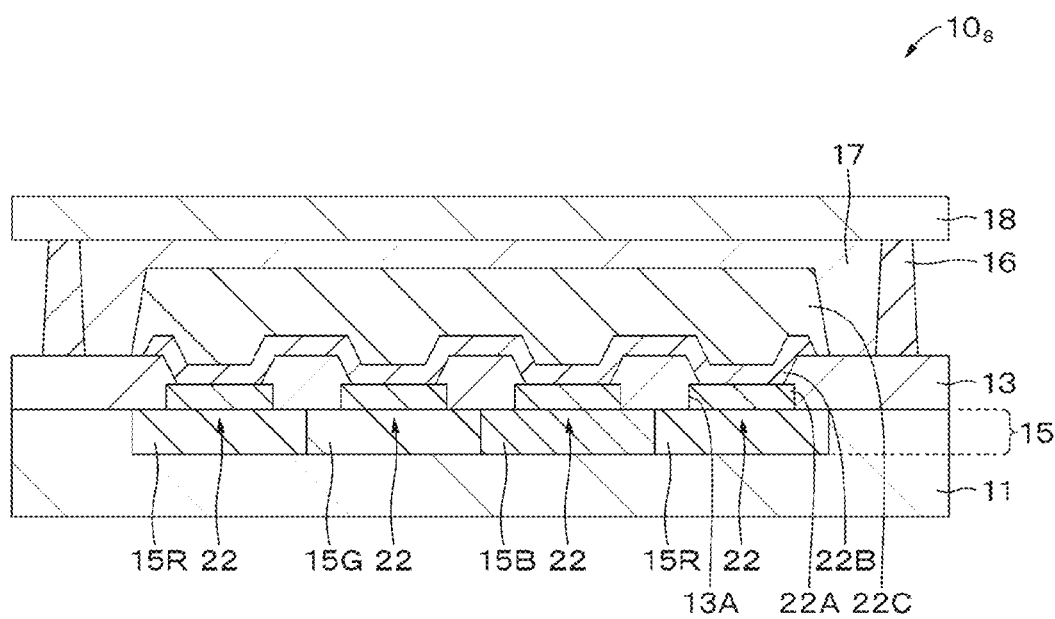
FIG. 15 is a cross-sectional view illustrating an example of a configuration of a display device according to an eighth modification of one embodiment of the present disclosure.

FIG. 15 illustrates an example of a configuration of a display device $10_8$ according to an eighth modification of one embodiment of the present disclosure. The display device $10_8$ is a bottom emission organic EL display device, and the color filter 15 is provided between the pixel drive circuit 140 or the like of the substrate 11 and a light emitting element 22. In the light emitting element 22, a first electrode 22A as, for example, a cathode, an organic layer 22B, and a second electrode 22C as, for example, an anode are laminated in this order from the side of the substrate 11. Since light is extracted from the side of the substrate 11 (bottom side), a transparent electrode that is transparent to the light generated in the organic layer 22B is used as the first electrode 22A. Further, a substrate that is transparent to the light generated in the organic layer 22B is used as the substrate 11. On the other hand, an opaque electrode that is not transparent to the light generated in the organic layer 22B may be used as the second electrode 22C.

In the display device $10_8$ according to the eighth modification of one embodiment described above, since light is extracted from the side of the substrate 11 (bottom side), the second electrode 22C does not need to be transparent, and thus the second electrode 22C can be made thick. Consequently, even if the surface of the second electrode 22C is oxidized, the influence on the film quality of the entire second electrode 22C is minimized. As a result, it is not necessary to provide the protective layer 14 in order to suppress the oxidation of the second electrode 22C, and thus the configuration of the display device $10_8$ can be simplified.

Ninth Modification

Figure 16:
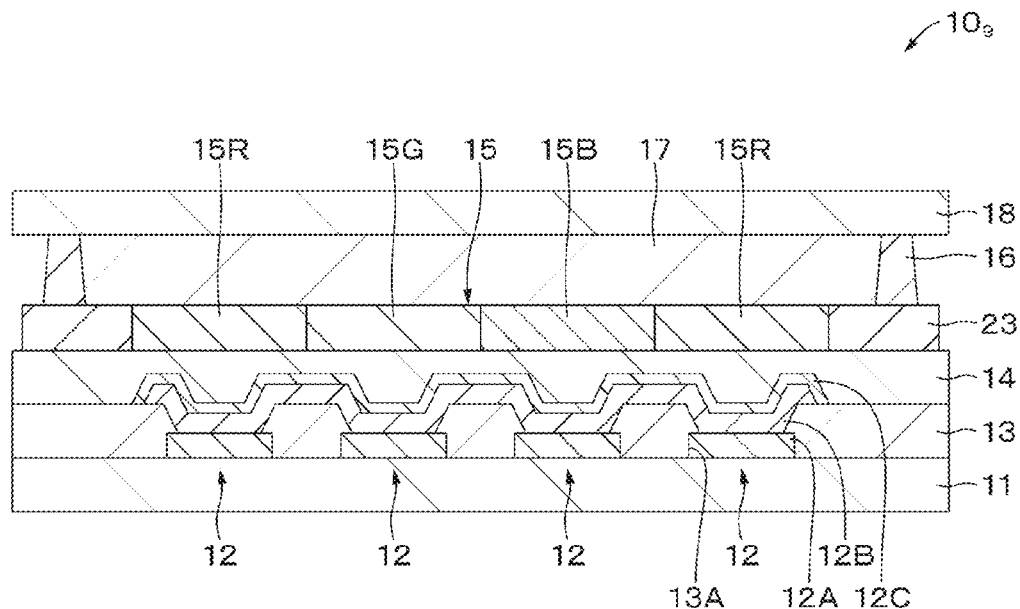
FIG. 16 is a cross-sectional view illustrating an example of a configuration of a display device according to a ninth modification of one embodiment of the present disclosure.

FIG. 16 illustrates an example of a configuration of a display device $10_9$ according to a ninth modification of one embodiment of the present disclosure.

The display device $10_9$ is different from the display device 10 according to the first embodiment in that a light-shielding layer 23 is further provided between the protective layer 14 and the wall portion 16. For example, the light-shielding layer 23 is provided outside the color filter 15 in an in-plane direction of the protective layer 14, and may be continuously and integrally formed with the color filter 15, or may be separated from the color filter 15 and configured as a separate body. The light-shielding layer 23 may be an inorganic material or an organic material. The light-shielding layer 23 preferably contains a black material from the viewpoint of improving a light-shielding property, but may contain at least one of a red pigment, a green pigment, or a blue pigment. As the black material, for example, at least one of a carbon material such as carbon black or a black metal oxide material such as titanium black can be used.

The light-shielding layer 23 may also be formed by using the process of forming the color filter 15. In this case, the light-shielding layer 23 may be configured with, for example, one light-shielding layer (one black layer) of the color filter 15, may be configured by laminating three layers of the red filter 11R, the green filter 11G, and the blue filter 11B, or may be configured by laminating two layers of the red filter 11R and the blue filter 11B.

In the display device $10_9$ according to the ninth modification of one embodiment described above, since the light-shielding layer 23 is provided between the protective layer 14 and the wall portion 16, it is possible to suppress the phenomenon that an underlying metal or the like (for example, first electrode 12A, second electrode 12C, or the like) reflects light (mainly external light) and appears to shine.

Tenth Modification

The wall portion 16 may also have the function of the light-shielding layer 23 of the ninth modification. In this case, instead of the light-shielding layer 23 of the ninth modification, the wall portion 16 with the light-shielding property may be provided, or the wall portion 16 with the light-shielding property may be provided together with the light-shielding layer 23 of the ninth modification. The wall portion 16 includes, for example, at least one of a carbon material such as carbon black or a black metal oxide material such as titanium black.

Eleventh Modification

The flexible display device 10 may be configured by using films as the substrate 11 and the counter substrate 18. In this case, the drive circuit or the like included in the substrate 11 is preferably configured with an organic thin film transistor (TFT) or the like from the viewpoint of suppressing damage to the film due to heat.

Twelfth Modification

The above one embodiment describes the case where all the light emitting elements 12 are assumed to emit white light, and each color light beam is extracted by the color filter 15 provided separately, but the present disclosure is not limited to this. For example, by coating the organic layer 12B separately using predetermined materials, a plurality of organic light emitting elements that respectively emit red light, green light, and blue light may be provided.

Thirteenth Modification

The above one embodiment describes the case where the wall portion 16 is formed by using the photolithography technique and the etching technique, but the wall portion 16 may be formed by using the nanoimprint technique. As the nanoimprint technique, for example, an optical nanoimprint technique such as a UV nanoimprint technique, or a thermal nanoimprint technique can be used. In this case, the wall portion 16 contains a photocurable resin such as an ultraviolet curable resin or a thermosetting resin. In the display device 10 and the method of manufacturing the display device 10 according to the eleventh modification, operations and effects similar to those in one embodiment described above can be obtained.

5 APPLICATION EXAMPLES (Electronic Apparatus)

Figure 17:
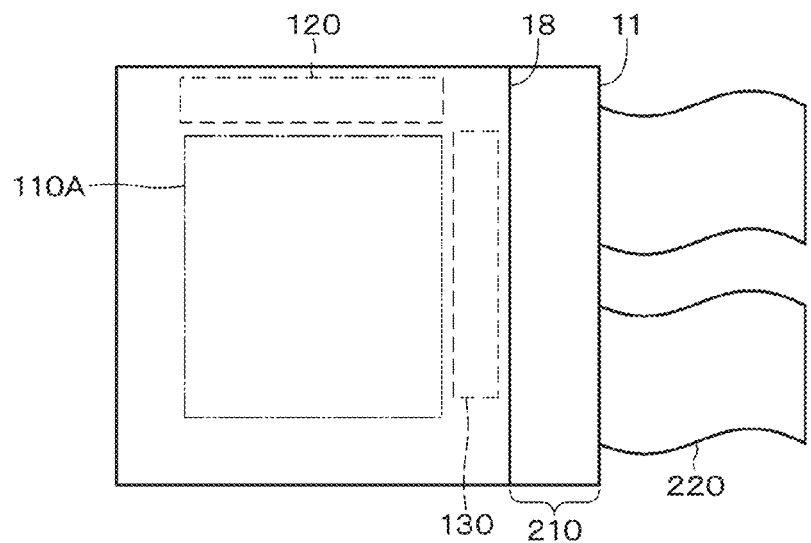
FIG. 17 is a plan view illustrating an example of a schematic configuration of a module.

The display device according to any of one embodiment and modifications thereof is incorporated in various electronic apparatuses as, for example, a module illustrated in FIG. 17. In particular, the display device is suitable for those that require high resolution and are used near the eyes for enlargement such as electronic viewfinders of video cameras and single-lens reflex cameras or head-mounted displays. This module has an area 210 that is exposed without being covered by the counter substrate 18 and the filling resin layer 17 on one short side of the substrate 11, and the external connection terminals 31 (see FIG. 4) are formed on the area 210 by extending the wires of the signal line drive circuit 120 and the scanning line drive circuit 130. A flexible printed circuit (FPC) 220 for inputting and outputting signals may be connected to the external connection terminal 31.

First Specific Example

Figure 18A:
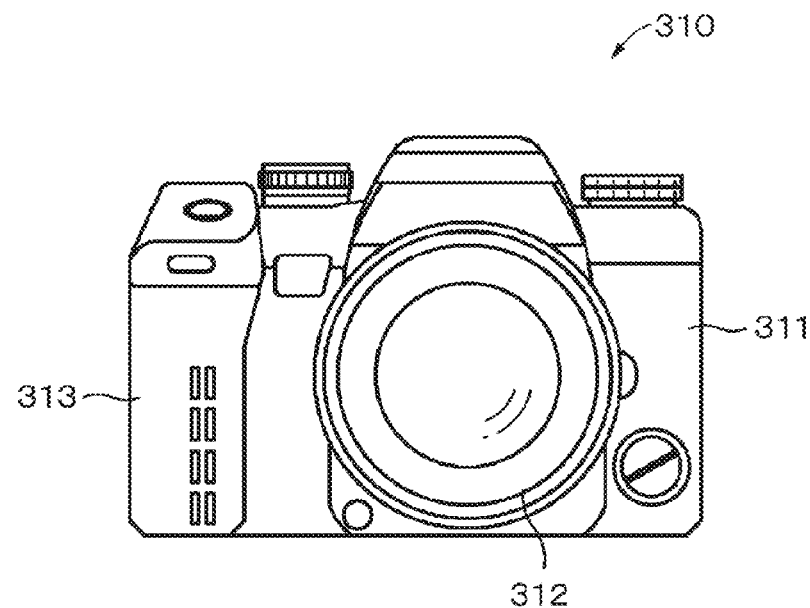
FIG. 18A is a front view illustrating an example of an appearance of a digital still camera.
Figure 18B:
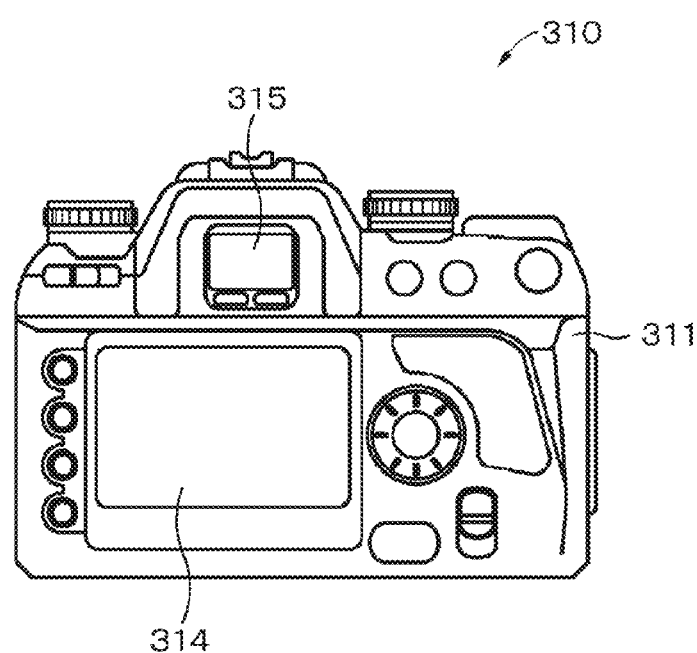
FIG. 18B is a rear view illustrating an example of the appearance of the digital still camera.

FIGS. 18A and 18B illustrate an example of an appearance of a digital still camera 310. This digital still camera 310 is a single-lens reflex camera with interchangeable lenses, and has an interchangeable shooting lens unit (interchangeable lens) 312 substantially in the center of the front of a camera main body portion (camera body) 311 and a grip portion 313 that is gripped by a photographer on the left side of the front.

A monitor 314 is provided at a position shifted to the left from the center of the back of the camera main body portion 311. An electronic viewfinder (eyepiece window) 315 is provided above the monitor 314. By looking into the electronic viewfinder 315, the photographer can visually recognize an optical image of a subject, the optical image being guided by the shooting lens unit 312, and determine the composition. As the electronic viewfinder 315, the display device according to any of one embodiment described above or the modifications thereof can be used.

Second Specific Example

Figure 19:
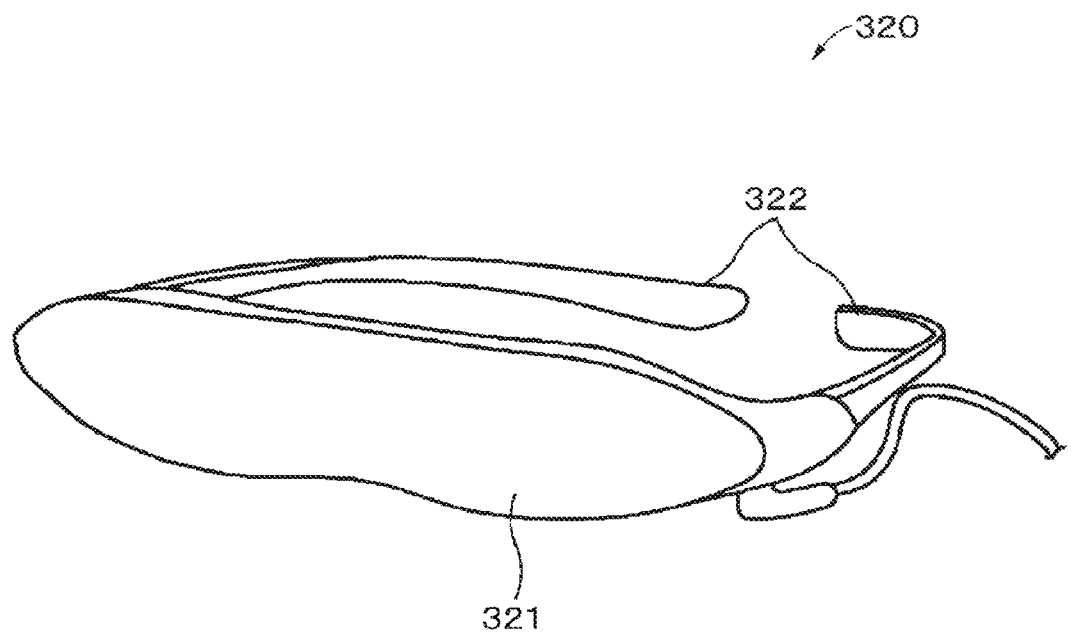
FIG. 19 is a perspective view illustrating an example of an appearance of a head-mounted display.

FIG. 19 illustrates an example of an appearance of a head-mounted display 320. The head-mounted display 320 has, for example, ear hooks 322 for being worn on a user's head on both sides of a display unit 321 that has an eyeglass shape. As the display unit 321, the display device according to any of one embodiment described above or the modifications thereof can be used.

Third Specific Example

Figure 20:
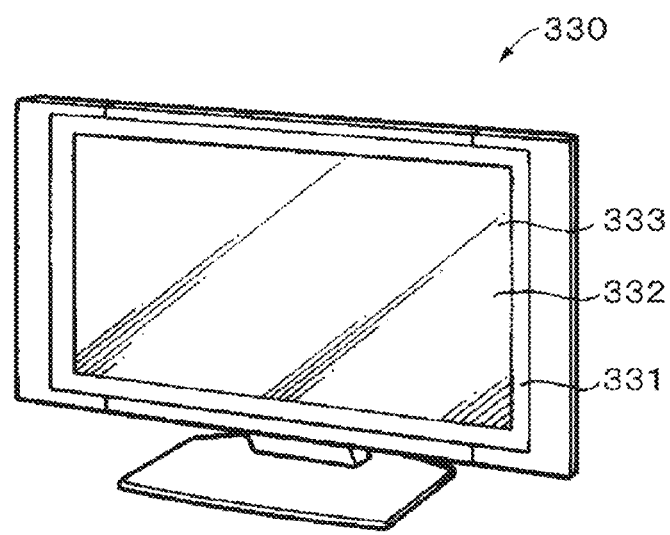
FIG. 20 is a perspective view illustrating an example of an appearance of a television device.

FIG. 20 illustrates an example of an appearance of a television device 330. The television device 330 has, for example, a video display screen unit 331 including, for example, a front panel 332 and a filter glass 333, and the video display screen unit 331 is configured with the display device according to any of one embodiment described above or the modifications thereof.

(Lighting Device)

The above one embodiment describes an example of applying the present disclosure to a display device, but the present disclosure is not limited to this, and the present disclosure may be applied to a lighting device.

Figure 21:
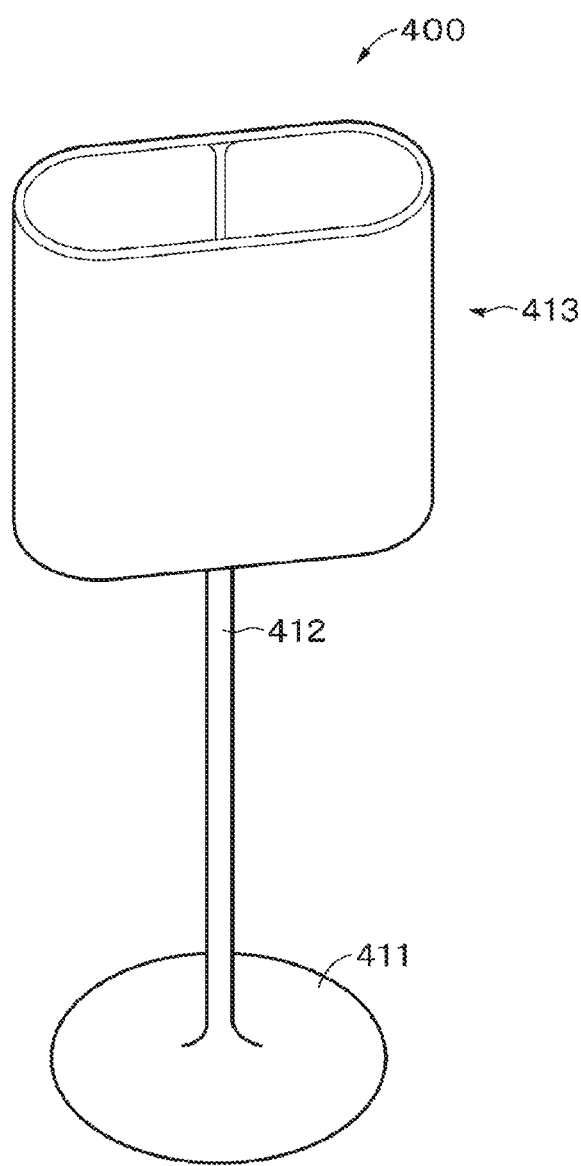
FIG. 21 is a perspective view illustrating an example of an appearance of a lighting device.

FIG. 21 illustrates an example of an appearance of a stand-type lighting device 400. In this lighting device 400, a lighting unit 413 is attached to a pole 412 provided on a base 411. As the lighting unit 413, a display device in which the color filter 15 is removed from the display device according to any of one embodiment described above or the modifications thereof, and instead of the drive circuit for a display device such as the signal line drive circuit 120 and the scanning line drive circuit 130, a drive circuit for a lighting device is provided is used. Further, the size of the opening 13A of the insulating layer 13 is appropriately selected according to the optical characteristics of the lighting device 400. Furthermore, the wall portion 16 is provided so as to surround a light emitting area. Moreover, by using films as the substrate 11 and the counter substrate 18 to achieve a flexible configuration, it is possible to have any shape such as a tubular shape illustrated in FIG. 21 or a curved surface shape. It should be noted that the number of the light emitting elements 12 may be singular. Further, a monochromatic filter may be provided instead of the color filter 15.

Here, the case where the lighting device is the stand-type lighting device 400 is described, but the form of the lighting device is not limited to this, and may be, for example, a form installed on a ceiling, a wall, a floor, or the like.

One embodiment of the present disclosure and the modifications thereof are specifically described above, but the present disclosure is not limited to one embodiment described above and the modifications thereof, and various modifications are possible on the basis of the technical idea of the present disclosure.

For example, the configurations, methods, steps, shapes, materials, numerical values, and the like given in one embodiment described above and the modifications thereof are merely examples, and different configurations, methods, steps, shapes, materials, numerical values, and the like may be used if necessary.

In addition, the configurations, methods, steps, shapes, materials, numerical values, and the like of one embodiment described above and the modifications thereof can be combined with each other without departing from the gist of the present disclosure.

Furthermore, the present disclosure may also adopt the following configuration.

(1)
A display device including:
a first substrate;
a plurality of light emitting elements that is provided on the first substrate;
a second substrate that is provided so as to face a plurality of the light emitting elements;
a wall portion that is provided on the first substrate, surrounds an effective pixel area, and supports the second substrate; and
a filling resin layer with which a space surrounded by the first substrate, the second substrate, and the wall portion is filled.

(2)
The display device according to (1), further including a protective layer that is provided on a plurality of the light emitting elements.

(3)
The display device according to (2), in which the wall portion is provided on the protective layer.

(4)
The display device according to (3), further including a light-shielding layer provided between the protective layer and the wall portion.

(5)
The display device according to any one of (1) to (4), further including an outer wall portion that is provided outside the wall portion and supports the second substrate,
in which the wall portion includes a hole that penetrates the wall portion in a width direction.

(6)
The display device according to any one of (1) to (5), in which the wall portion includes a resist.

(7)
The display device according to any one of (1) to (6), in which the wall portion has a frame shape.

(8)

The display device according to any one of (1) to (7), in which the filling resin layer has an adhesive property.

(9)

The display device according to any one of (1) to (8), in which a height of the wall portion is 2 μm or more and 5 μm or less, and
a width of the wall portion is 2 μm or more and 50 μm or less.

(10)

The display device according to any one of (9) to (8), in which a cross-section of the wall portion in a width direction of the wall portion is a rectangle or a trapezoid.

(11)

The display device according to any one of (1) to (10), in which the wall portion does not contain a filler.

(12)

The display device according to any one of (1) to (11), further including a protective member that covers a peripheral surface.

(13)

An electronic apparatus including the display device according to any one of (1) to (12).

(14)

A method of manufacturing a display device, the method including:
forming a plurality of light emitting elements on a first substrate;
forming a wall portion that surrounds an effective pixel area on the first substrate; and
after coating an inside of the wall portion with a resin, mounting a second substrate on the wall portion and curing the resin to bond the first substrate and the second substrate.

(15)

The method of manufacturing a display device according to (14), further including forming a protective layer on a plurality of the light emitting elements,
in which the wall portion is formed on the protective layer.

(16)

A lighting device including:
a first substrate;
a light emitting element that is provided on the first substrate;
a second substrate that is provided so as to face the light emitting element;
a wall portion that is provided on the first substrate, surrounds a light emitting area, and supports the second substrate; and
a filling resin with which a space surrounded by the first substrate, the second substrate, and the wall portion is filled.

REFERENCE SIGNS LIST

10, $10_1$, $10_2$, $10_3$, $10_4$, $10_5$, $10_6$, $10_7$, $10_8$, $10_9$ Display device
10R, 10G, 10B Sub-pixel
11 Substrate (first substrate)
12, 22 Light emitting element
12A, 22A First electrode
12B, 22B Organic layer
$12B_1$ Hole injection layer
$12B_2$ Hole transport layer
$12B_3$ Light emitting layer
$12B_4$ Electron transport layer
12C, 22C Second electrode 12
13 Insulating layer
14 Protective layer
15 Color filter
16 Wall portion
16A Inner wall portion
$16A_1$ Hole
16B Outer wall portion
16C Space
17 Filling resin layer
17A Filling resin
18 Counter substrate (second substrate)
19 Structure
20 Flattening layer
21 Protective layer
23 Light-shielding layer
31 External connection terminal
110A Display area
110B Peripheral area
120 Signal line drive circuit
130 Scanning line drive circuit
120A Signal line
130A Scanning line
140 Pixel drive circuit
310 Digital still camera (electronic apparatus)
320 Head-mounted display (electronic apparatus)
330 Television device (electronic apparatus)
400 Lighting device

The invention claimed is:

1. A display device, comprising:
a first substrate;
a plurality of light emitting elements on the first substrate;
a second substrate that faces the plurality of light emitting elements;
a wall portion on the first substrate, wherein
the wall portion surrounds an effective pixel area on the first substrate,
the wall portion supports the second substrate,
a height of the wall portion is 2 μm or more and 5 μm or less, and
a width of the wall portion is 2 μm or more and 50 μm or less; and
a filling resin layer that fills a space surrounded by the first substrate, the second substrate, and the wall portion.

2. The display device according to claim 1, further comprising a protective layer on the plurality of light emitting elements.

3. The display device according to claim 2, wherein the wall portion is on the protective layer.

4. The display device according to claim 3, further comprising a light-shielding layer between the protective layer and the wall portion.

5. The display device according to claim 1, further comprising an outer wall portion outside the wall portion, wherein
the outer wall portion supports the second substrate, and
the wall portion includes a hole that penetrates the wall portion in a width direction of the wall portion.

6. The display device according to claim 1, wherein the wall portion includes a resist.

7. The display device according to claim 1, wherein the wall portion has a frame shape.

8. The display device according to claim 1, wherein the filling resin layer has an adhesive property.

9. The display device according to claim 1, wherein a cross-section of the wall portion in a width direction of the wall portion is one of a rectangle or a trapezoid.

10. The display device according to claim 1, wherein the wall portion does not contain a filler.

11. The display device according to claim 1, further comprising a protective member that covers a peripheral surface of the display device.

12. An electronic apparatus, comprising:
a display device that includes:
a first substrate;
a plurality of light emitting elements on the first substrate;
a second substrate that faces the plurality of light emitting elements;
a wall portion on the first substrate, wherein
the wall portion surrounds an effective pixel area on the first substrate,
the wall portion supports the second substrate,
a height of the wall portion is 2 μm or more and 5 μm or less, and
a width of the wall portion is 2 μm or more and 50 μm or less; and
a filling resin layer that fills a space surrounded by the first substrate, the second substrate, and the wall portion.

13. A method of manufacturing a display device, comprising:
forming a plurality of light emitting elements on a first substrate;
forming a wall portion that surrounds an effective pixel area of the first substrate, wherein
the wall portion is on the first substrate,
a height of the wall portion is 2 μm or more and 5 μm or less, and
a width of the wall portion is 2 μm or more and 50 μm or less;
coating an inner portion of the wall portion with a resin;
mounting a second substrate on the wall portion; and
curing the resin to bond the first substrate and the second substrate.

14. The method of manufacturing the display device according to claim 13, further comprising forming a protective layer on the plurality of light emitting elements, wherein the wall portion is on the protective layer.

15. A lighting device, comprising:
a first substrate;
a light emitting element on the first substrate;
a second substrate that faces the light emitting element;
a wall portion on the first substrate, wherein
the wall portion surrounds a light emitting area on the first substrate,
the wall portion supports the second substrate,
a height of the wall portion is 2 μm or more and 5 μm or less, and
a width of the wall portion is 2 μm or more and 50 μm or less; and
a filling resin that fills a space surrounded by the first substrate, the second substrate, and the wall portion.

* * * * *